United States Patent [19]
Yang et al.

[11] Patent Number: 6,080,526
[45] Date of Patent: Jun. 27, 2000

[54] INTEGRATION OF LOW-K POLYMERS INTO INTERLEVEL DIELECTRICS USING CONTROLLED ELECTRON-BEAM RADIATION

[75] Inventors: Jingjun Yang, Cupertino; Lynn Forester, San Jose, both of Calif.; Dong Kyu Choi, Sung-Nam Si, Rep. of Korea; Shi-Qing Wang, Campbell; Neil H. Hendricks, Sonora, both of Calif.

[73] Assignee: AlliedSignal Inc., Morristown, N.J.

[21] Appl. No.: 09/028,465

[22] Filed: Feb. 24, 1998

Related U.S. Application Data

[60] Provisional application No. 60/041,104, Mar. 24, 1997.

[51] Int. Cl.$^7$ .................................................. G03F 7/40
[52] U.S. Cl. .................. 430/296; 430/311; 430/942; 427/551; 427/552; 427/553
[58] Field of Search ................... 427/551, 552, 427/553, 595, 596; 430/296, 311, 942

[56] References Cited

U.S. PATENT DOCUMENTS

| | | | |
|---|---|---|---|
| 4,222,792 | 9/1980 | Lever et al. ........................... 148/1.5 |
| 4,435,441 | 3/1984 | Mariani et al. ........................ 427/10 |
| 4,503,126 | 3/1985 | Phillips et al. ........................ 428/412 |
| 4,661,193 | 4/1987 | Kerchhoff et al. ................... 156/307.3 |
| 5,141,970 | 8/1992 | McArdle et al. ...................... 522/170 |
| 5,229,172 | 7/1993 | Cahalan et al. ....................... 427/536 |
| 5,262,392 | 11/1993 | Hung et al. .............................. 505/1 |
| 5,270,259 | 12/1993 | Ito et al. ................................. 437/235 |
| 5,468,595 | 11/1995 | Livesay .................................. 430/296 |
| 5,504,042 | 4/1996 | Cho et al. ............................... 437/247 |
| 5,523,615 | 6/1996 | Cho et al. ............................... 257/632 |
| 5,545,475 | 8/1996 | Korleski ............................... 428/306.6 |
| 5,609,925 | 3/1997 | Camilleti et al. ....................... 427/503 |
| 5,707,681 | 1/1998 | Bremmer et al. ........................ 427/58 |
| 5,763,049 | 6/1998 | Frey et al. ............................. 428/172 |
| 5,843,537 | 12/1998 | Kim et al. .............................. 427/504 |
| 5,863,963 | 1/1999 | Narang et al. ......................... 522/162 |
| 5,883,212 | 3/1999 | Bennett ................................. 526/312 |
| 5,916,641 | 6/1999 | McArdle et al. ....................... 427/487 |
| 5,919,561 | 7/1999 | Fuchs et al. ........................... 428/336 |
| 5,936,813 | 8/1999 | Kim et al. .............................. 360/113 |
| 5,939,334 | 8/1999 | Nguyen et al. ........................ 438/689 |
| 5,942,373 | 8/1999 | Chou et al. ............................ 430/296 |
| 5,946,559 | 8/1999 | Leedy ................................... 438/157 |

FOREIGN PATENT DOCUMENTS

| | | |
|---|---|---|
| 0701277 | 3/1996 | European Pat. Off. . |
| WO 97/00535 | 1/1997 | WIPO . |

OTHER PUBLICATIONS

Stanley Wolf, Silicon Processing for the VLSI Era vol. 2—Process Integration, Lattice Press, p. 106, 1990.

*Primary Examiner*—Charles Bowers
*Assistant Examiner*—Robert Hullinger
*Attorney, Agent, or Firm*—Leslie A. Weise; Roger H. Criss

[57] ABSTRACT

A process for the preparation of substrates used in the manufacture of integrated circuits wherein spin-on low dielectric constant (low-k) polymer films are applied on semiconductor substrates. A non-etchback processing of spin-on low-k polymer films, without losing the low dielectric constant feature of the film, especially in between metal lines, is achieved utilizing electron beam radiation. A polymeric dielectric film is applied and dried onto a substrate and exposed to electron beam radiation under conditions sufficient to partially cure the dielectric layer. The exposing forms a relatively more hardened topmost portion of the dielectric layer and a relatively less hardened underlying portion of the dielectric layer.

24 Claims, 11 Drawing Sheets

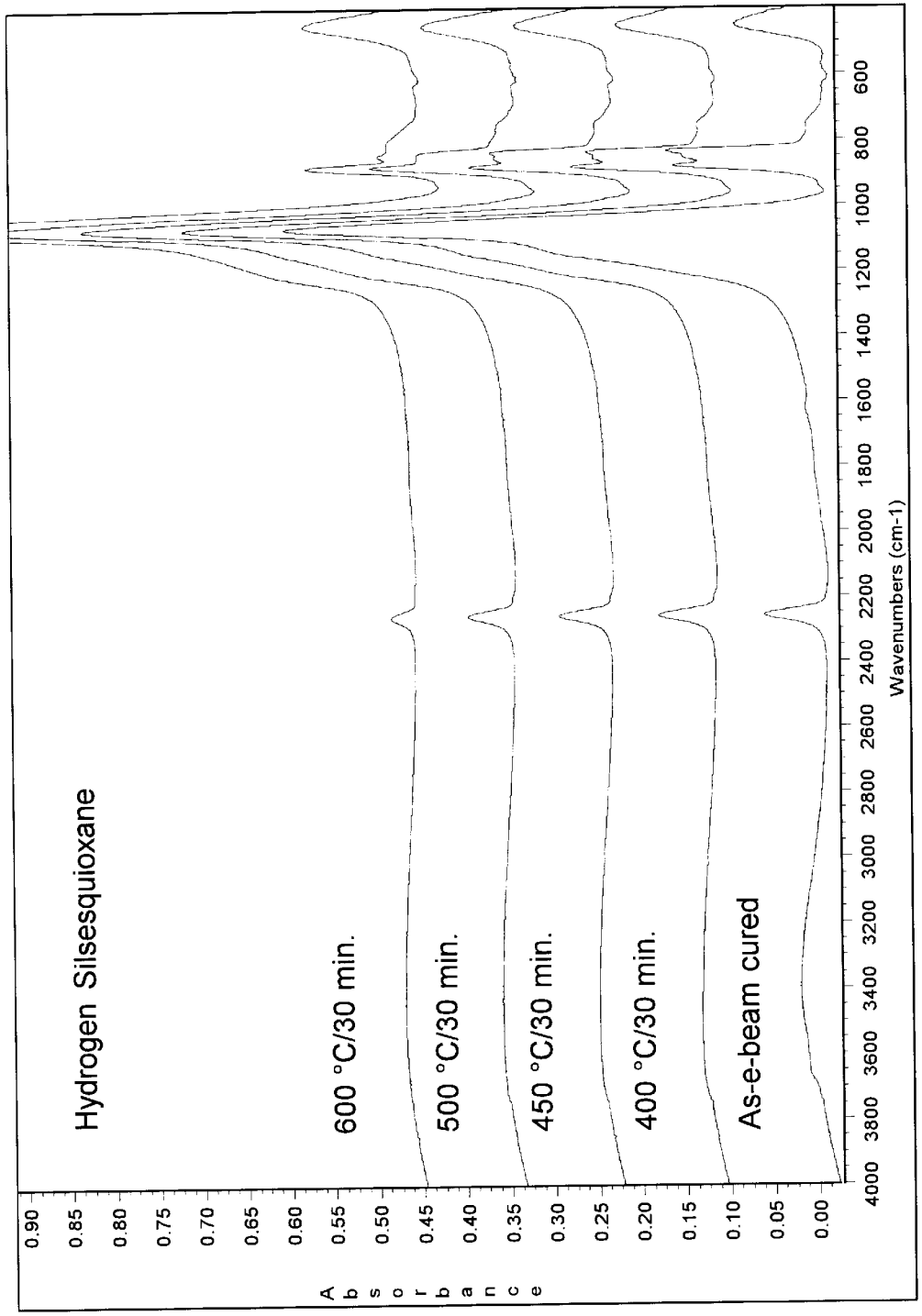

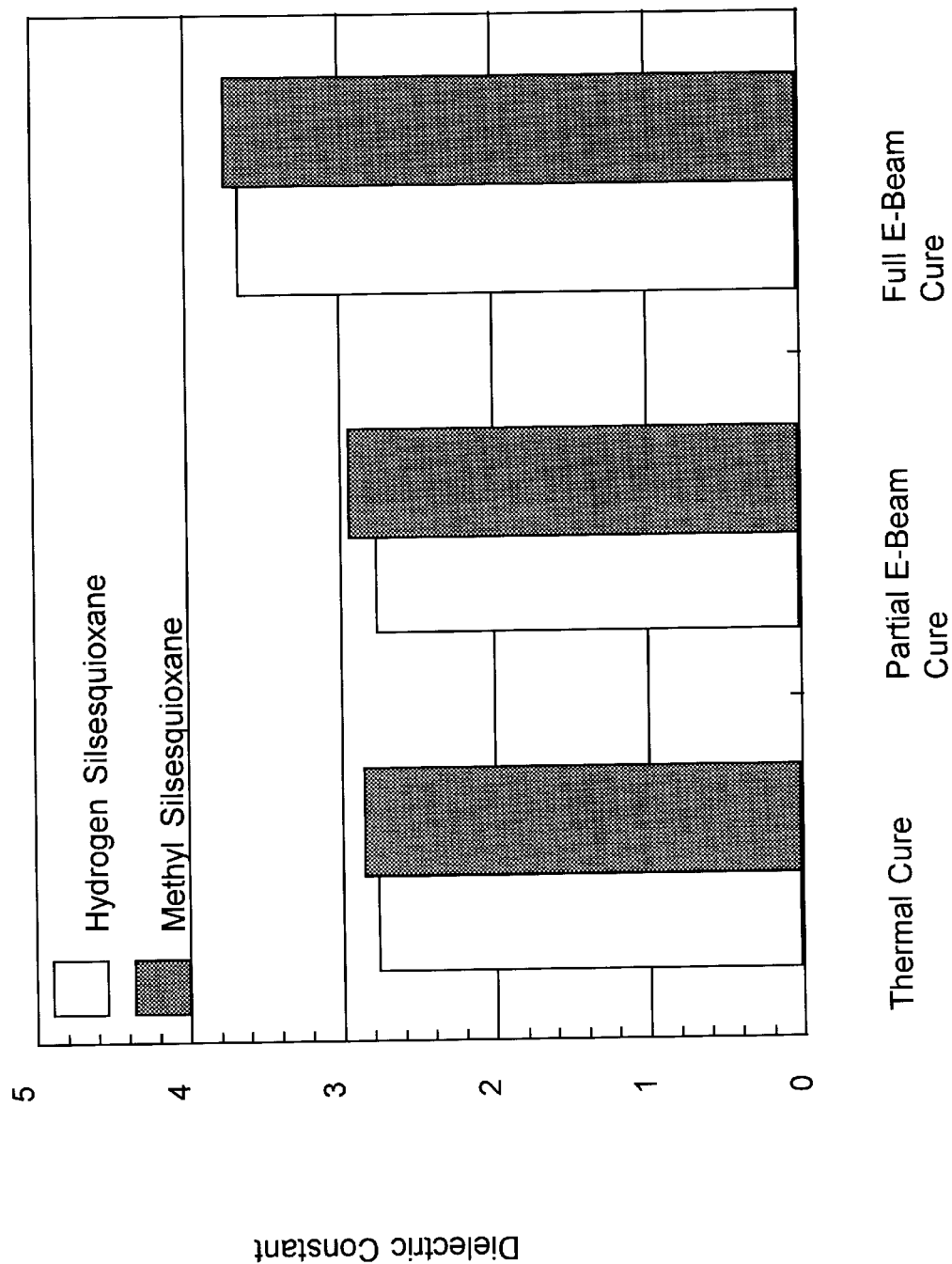

INTEGRATION OF LOW-K POLYMERS INTO INTERLEVEL DIELECTRICS USING CONTROLLED ELECTRON-BEAM RADIATION

CROSS REFERENCE TO RELATED APPLICATION

This application claims the benefit of U.S. provisional application Ser. No. 60/041,104, filed Mar. 24, 1997 (pending) which is incorporated herein by reference.

BACKGROUND OF THE INVENTION

1. Field of the Invention

The present invention relates to the preparation of substrates used in the manufacture of integrated circuits. More particularly, the invention relates to spin-on low dielectric constant (low-k) polymer films on semiconductor substrates. The invention provides a method for achieving non-etchback processing of spin-on low-k polymer films and for retaining the low dielectric constant of spin-on polymer films in areas between metal lines on semiconductor substrates, utilizing electron beam radiation in integration of low-k polymer films into interlevel dielectric (ILD) layers of semiconductor devices.

2. Description of the Prior Art

A continuing trend in semiconductor technology is the formation of integrated circuit (IC) chips having more and faster circuits thereon. Such ultralarge scale integration has resulted in a continued shrinkage of feature sizes with the result that a large number of devices are made available on a single chip. With a limited chip surface area, the interconnect density typically expands above the substrate in a multi-level arrangement and the devices have to be interconnected across these multiple levels. The interconnects must be electrically insulated from each other except where designed to make contact. Usually electrical insulation requires depositing dielectric films onto a surface, for example using a CVD or spinning-on process. The shrinkage in integrated circuit design rules has simultaneously reduced the wiring pitch. These have made the signal propagation delay in the interconnects an appreciable fraction of the total cycle time. The motivation to minimize signal delay has driven extensive studies to develop a low dielectric constant (low-k) material that can be used as interlevel dielectric in integrated circuit (IC) manufacturing. The majority of low-k materials used in the ILD layer are based on thermally cured spin-on organic or inorganic polymers. Although these low-k materials have the desirable low dielectric constant, the integration processes associated with these films are complex, and often require an etchback process followed by capping the dielectric layer using a conventional chemical vapor oxide deposition (CVD). In addition, the dielectric constant of many thermally cured low-k polymer films is not stable and is prone to increase upon exposure to either high temperature encountered in metal deposition, or to oxidative environments such as oxygen plasma used in photoresist stripping. These drawbacks associated with thermally cured spin-on polymer films are often related to their intrinsic features such as low density, susceptibility to moisture absorption, poor thermal stability and susceptibility to oxygen plasma-induced oxidation. Therefore, the integration of many thermally cured spin-on low-k polymers into ILD layers is complex and often requires additional process steps such as etchback and capping. The dielectric constant of many thermally cured low-k polymers is increased during process integration and thus their low-k characteristics are partially or completely degraded upon completing the fabrication of the final semiconductor devices. It is known in the art to use organic polymer dielectrics as the IC interconnect insulator. Such include compositions as polyarylene ethers, fluorinated polyarylene ethers, silsesquioxanes and siloxanes. Examples of other organic polymer dielectrics and articles produced therefrom are disclosed in U.S. Pat. Nos. 5,145,936; 5,108,840; 5,115,082; 5,114,780; 5,155,175; 5,179,188; 5,250,667; 5,235,044; 5,173,542; and 5,270,453. In all these cases, the films are deposited by spin-coating onto a semiconductor substrate and then subjected to a full thermal cure.

SUMMARY OF THE INVENTION

The invention provides a process for forming a dielectric film on a substrate which comprises applying and drying a polymeric, dielectric composition layer onto a substrate and exposing the dried layer to electron beam radiation under conditions sufficient to partially cure the dielectric layer and wherein the exposing forms a relatively more hardened topmost portion of the dielectric layer and a relatively less hardened underlying portion of the dielectric layer.

The invention also provides a process as above and further comprising the steps, before electron beam exposing, of applying a layer of a photoresist onto the at least partially solidified dielectric layer on the substrate, imagewise exposing and developing the photoresist layer to thereby remove a portion of the photoresist layer from the dielectric layer and leaving a portion of the photoresist remaining on the dielectric layer; wherein the part of the dielectric layer underlying the portion of the photoresist remaining on the dielectric layer is exposed to less electron beam radiation than the part of the dielectric layer corresponding to the removed portion of the photoresist layer.

It has now been discovered that the properties of certain spin-on dielectric films used in IC interconnect processing are improved when those films are cured with a controlled electron beam radiation treatment when compared to a thermal cure. Thus, for example, the invention provides improved methods for achieving non-etchback process for spin-on low-k dielectrics using controlled electron beam radiation processes. The invention also provides improved methods for protecting the underlying dielectric layer from process environment induced degradation, particularly dielectric constant of certain spin-on low-k polymer films using a controlled electron beam radiation process. The invention also provides improved methods for retaining the intrinsic dielectric constant for spin-on polymer films in areas such as in between metal lines using controlled electron beam radiation process.

It has been discovered that if a freshly deposited spin-on dielectric film is exposed to an electron beam radiation under relative low energy conditions, subsequent to standard hotplate treatments, then a "skin" is formed as the outer layer of the film which has been most directly contacted by the electron beam radiation. The thickness of this "skin" can be regulated by the electron beam energy levels, including the time duration of exposure, and the integrated (total) electron beam dosage delivered to the film. Thus, the film can be only lightly cured such that a thin skin of nominally 500–6000 angstroms can be formed, depending on the interlayer dielectric thickness. A continuum of extents of cure for the films can be thus be advantageously used in semiconductor processing. A relatively brief cure in which a skin is formed simultaneously allows retention of the low dielectric constant of the film, attainment of a hardened, oxidation resistant outer layer on the film, and minimization of process time when compared to the electron beam radiation cure of the full thickness of the film. With this process, the original homogeneous dielectric layer can be converted into two distinctive layers. The dielectric layer on the top of metals is significantly modified and thus some of its properties have been significantly changed. This layer has such excellent properties as low or no moisture absorption and low or no degradation upon exposure to high temperature and oxygen plasma environments, and thus a non-etchback process can be achieved without degradation. The underlying dielectric layer, particularly in between-metal lines, retains its intrinsic dielectric properties such as low dielectric constant. The modified top layer protects the underlying dielectric layer and thus the properties of the underlying dielectric is not affected by high temperature and oxygen plasma exposure.

In another embodiment of the invention, a non-etchback dielectric process can be employed which eliminates the problem of poison vias caused by residual moisture and carbon-containing residues in the via after etch through dielectric layers. In this process, only the dielectric layer in the region where a photoresist has been developed that is, the region on the top of metal lines, will be selectively modified by controlled electron-beam radiation. In this case the controlled e-beam curing depth is dependent on the remaining dielectric thickness on top of metal lines. With this approach the via poisoning can be essentially eliminated while the dielectric between metal lines and the dielectric in interlevel metal lines retain a intrinsically low dielectric constant.

BRIEF DESCRIPTION OF THE DRAWINGS

FIG. 7 shows the dielectric constants for thermally cured, partially e-beam cured, and fully e-beam cured films.

DETAILED DESCRIPTION OF THE PREFERRED EMBODIMENT

Figure 1:
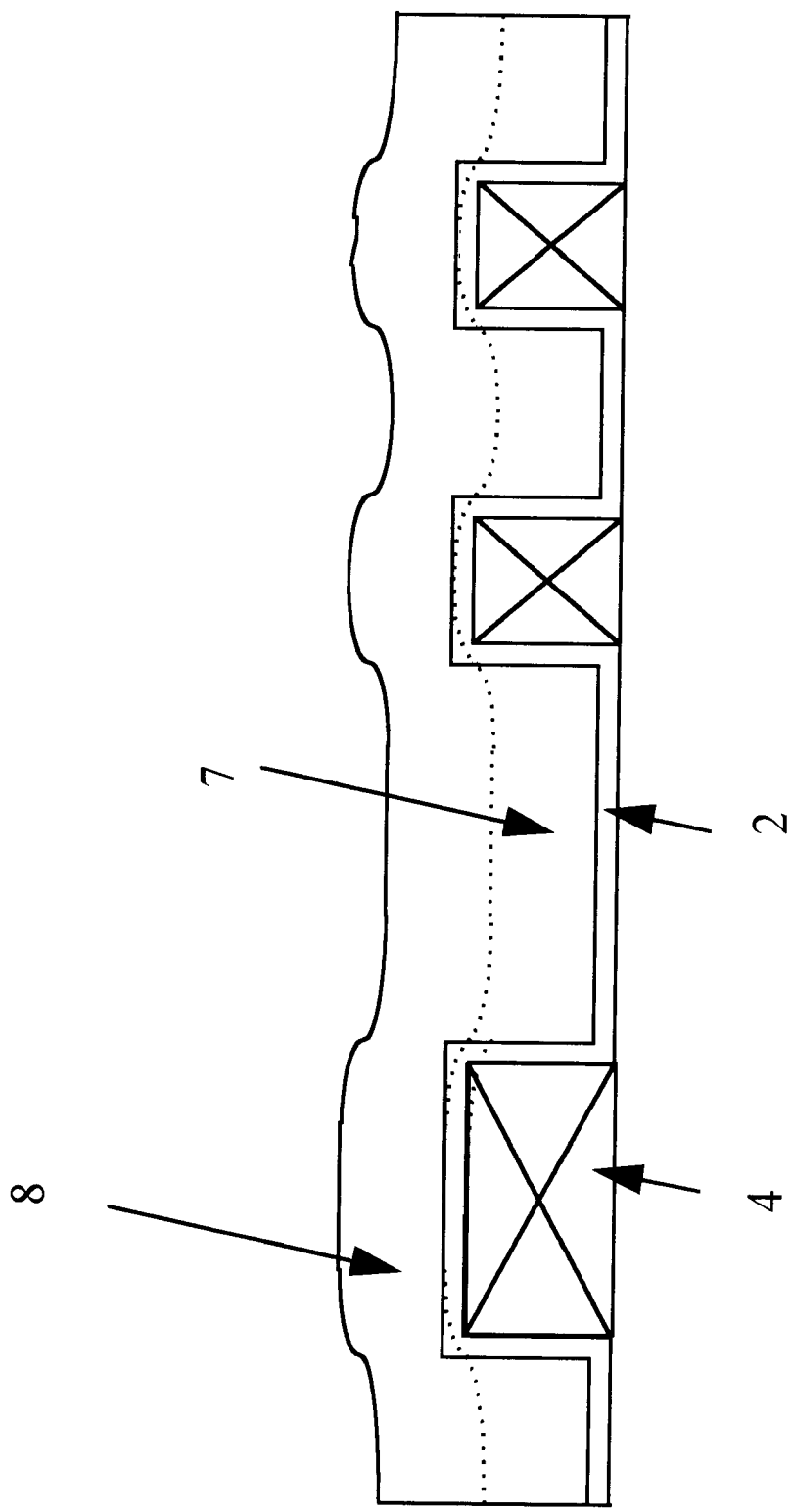
FIG. 1 is a schematic representation of one embodiment of the invention showing a non-etchback process for spin-on low-k polymers using controlled electron beam curing.

A first embodiment of the invention forms a dielectric film on a substrate by applying and drying a polymeric, dielectric composition layer onto a substrate. The dried layer is then exposed to electron beam radiation under conditions sufficient to partially cure the dielectric layer such that a relatively more hardened topmost portion of the dielectric layer forms on a top part of the layer and a relatively less hardened underlying portion of the dielectric layer forms under the top of the layer.

Typically the dielectric compositions are applied onto wafer substrates, which are to be processed into an IC or another microelectronic device. Suitable planar substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof, which may or may not have a circuit pattern on their surface.

A liquid dielectric layer, preferably a spin-on glass in a suitable solvent is applied to the substrate surface under ambient conditions. The dielectric layer may comprises a silsesquioxane polymer, a siloxane polymer, a polyarylene ether, a fluorinated polyarylene ether, polymeric dielectric materials or mixtures thereof. Polymeric dielectric materials useful for the invention include hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. The hydroorganosiloxanes, polyarylene ethers, fluorinated polyarylene ethers and mixtures thereof are preferred. Useful organic polymers include polyimides, fluorinated and nonfluorinated polymers, in particular fluorinated and nonfluorinated poly(arylethers) available under the tradename FLARE™ from AlliedSignal Inc., and copolymers mixtures thereof. Preferred siloxane materials suitable for use in this invention are commercially available from AlliedSignal Inc. under the tradename Accuglass®. The polymer component is preferably present in an amount of from about 10% to about 30% by weight of the composition. A more preferred range is from about 15% to about 30% and most preferably from about 17% to about 25% by weight of the composition.

The composition then contains a solvent component comprising at least one solvent. Suitable solvents nonexclusively include water and organic solvents in an amount sufficient to form a uniform solution or dispersion of the dielectric material. Examples of useful linear solvents nonexclusively include decamethyltetrasiloxane, 1,3-dioctyltetramethyldisiloxane, octamethyltrisiloxane, pentamethyldisiloxane, hexamethyldisiloxane, 1,1,3,3,5,5-hexamethyltrisiloxane, 1,1,3,3-tetramethyldisiloxane, 1,3-bis-(trimethylsiloxy)-1,3-dimethylsiloxane, bis (trimethylsiloxy)ethylsilane, bis(trimethylsiloxy) methylsilane, decamethyltetrasiloxane, dodecamethylpentasiloxane, 1,1,1,3,3,5,5-heptamethyltrisiloxane, hexaethyldisiloxane, heptamethyltrisiloxane and 1,1,3,3-tetraisopropyldisiloxane. Examples of useful cyclic solvents nonexclusively include decamethylcyclopentasiloxane, hexaethylcyclotrisiloxane, hexamethylcyclotrisiloxane, 1,3,5,7-tetramethylcyclotetrasiloxane, pentamethylcyclopentasiloxane, octamethylcyclotetrasiloxane, methylhydrocyclosiloxanes of the formula $(CH_3HSiO)_{3-5}$, 1,3,5,7-tetraethylcyclotetrasiloxane and 1,3,5,7-tetramethylcyclotetrasiloxane. It has been found that blends of the solvents of this invention are particularly preferred since by forming such blends one is able to fine tune the evaporation rate of the composition on a substrate. The solvent component is preferably present in the overall composition in an amount of from about 70% to about 90% by weight of the composition, more preferably from about 70% to about 85% and most preferably from about 75% to about 83% by weight of the composition.

The dielectric material may be applied to the substrates via conventional spin-coating, dip coating, spraying, or meniscus coating methods which are well-known in the art. Spin coating is most preferred. The thickness of the dielectric film on the substrate may vary depending on the amount of liquid dielectric that is applied to the substrate, but typically the thickness may range from about 500 Å to about 50,000 Å, and preferably from about 2000 Å to about 12000 Å. The amount of dielectric liquid applied to the substrate may vary from about 1 ml to about 10 ml, and preferably from about 2 ml to about 8 ml. In the preferred embodiment, the liquid material is spun onto the upper surface the substrate according to known spin techniques. Preferably, the dielectric is applied from a solution which is centrally applied to the substrate and then spun on a rotating wheel at speeds ranging between about 500 and about 6000 rpm, preferably from about 1500 to about 4000 rpm, for about 5 to about 60 seconds, preferably from about 10 to about 30 seconds, in order to spread the solution evenly across the substrate surface. The dielectric layer preferably has a density of from about 1 g/cm$^3$ to about 3 g/cm$^3$.

After the dielectric material is applied to the substrate, the dielectric-substrate combination is optionally, but preferably heated for a time and at a temperature sufficient to evaporate solvents present within the dielectric film and partially cure the film. The desired degree of partial curing may be determined by one skilled in the art without undue experimentation. This thermal treatment prior to e-beam exposure is dependent on materials and coating methods. Generally, the dielectric coated substrate is heated at a temperature of from about 50° C. to about 450° C., more preferably from about 80° C. to about 375° C. for about 0.5 to about 30 minutes, more preferably from about 1 to about 3 minutes. This is preferably done on a hot plate but may also be done in an oven. In a preferred embodiment, the dielectric is first heated at from about 80° C. to about 180° C. for about 30 seconds to about two minutes, then heated at from about 150° C. to about 250° C. for about 30 seconds to about two minutes, and heated a third time at from about 180° C. to about 375° C. for from about 30 seconds to about two minutes. The heat treatment of the film partially crosslinks and solidifies and partially planarizes the layer. After the coating is heated, the thickness of the resulting film ranges from about 500 Å to about 50,000 Å, preferably from about 500 Å to about 20,000 Å, and most preferably from about 1,000 Å to about 12,000 Å.

An important feature of the invention is to expose the dried layer to electron beam radiation under conditions sufficient to partially cure the dielectric layer wherein the exposing forms a relatively more hardened topmost skin portion of the dielectric layer and a relatively less hardened underlying portion of the dielectric layer. For example, a topmost more cured portion of the dielectric layer may have a thickness of from about 200 to about 10,000 angstroms with the underlying balance being less cured or crosslinked. In one case, the topmost portion of the dielectric layer is exposed to the electron beam radiation and the underlying portion of the dielectric layer is essentially not exposed to the electron beam radiation at all at the lowest portion adjacent the substrate. In another case, the underlying portion is subjected to a graduated degree of exposure throughout the layer.

The coated substrate is cured by exposing the surface of the substrate to a flux of electrons. The temperature at which the electron beam exposure is conducted will depend on the desired characteristics of the resulting film and the length of desired processing time. One of ordinary skill in the art can readily optimize the conditions of exposure to get the claimed results but the heating temperature will generally be in the range of from about 50° C. to about 500° C., preferably from about 150° C. to about 400° C. Heating may be conducted from about 1 to about 360 minutes, preferably from about 3 minutes to about 30 minutes. In another embodiment, such heating may be done before rather than during the e-beam exposure. The pressure during electron beam curing will range from about 0.1 mtorr to about 100 torr, and preferably from about 1 mtorr to about 100 mtorr. The period of electron beam exposure will be dependent upon the strength of the beam dosage applied to the substrate and the beam current density. One of ordinary skill in the art can readily optimize the conditions of exposure to get the claimed results, but generally the exposure will range from about 1 minute to about 120 minutes, and preferably from about 3 minutes to about 60 minutes with application of an electron beam dose of about 500 to about 20,000 microcoulombs per square cm, preferably from about 2,000 to about 10,000 microcoulombs per square cm. The accelerating voltage of the electron beam may range from about 0.5 to about 20 KeV. The dose and energy selected will be proportional to the thickness of the films to be processed. The dielectric coated substrate may be exposed to electron beams in any chamber having a means for providing electron beam radiation to substrates placed therein. In a preferred embodiment, the dielectric coated substrate is placed into a chamber which is commercially available from Electron Vision, a unit of AlliedSignal Inc., under the tradename "ElectronCure"™. The principles of operation and performance characteristics of which are described in U.S. Pat. No. 5,001,178, which is incorporated herein by reference. This system has a large area electron source capable of exposing substrates up to 200 mm in diameter. Additionally, the electron source is variable energy. The e-beam exposure is preferably conducted while in the presence of a gas selected from the group consisting hydrogen, helium, argon, nitrogen, oxygen, xenon and their mixtures thereof, and preferably argon, hydrogen, oxygen and mixtures thereof. The selection of the process gas is mainly dependent on materials.

FIG. 1 shows a schematic representation of one embodiment of the invention showing a non-etchback process for spin-on low-k polymers using controlled electron beam curing. There is shown a chemically vapor deposited oxide layer 2 which covers metal conductors 4 on a substrate. A dielectric polymer is spin coated onto the oxide and baked until dried. The polymer is exposed to e-beam radiation wherein the e-beam penetration is controlled to be approximately equal to the thickness 8 of the dielectric film on top of the metal conductors. The underlying region 7 receive little or no e-beam exposure. The dotted line represents the interface between these zones.

The most important parameter among other parameters for the said e-beam curing processes is electron beam energy which determines electron beam penetration depth and thus the curing depth of the film. The desired e-beam curing depth depends on the thickness of the dielectric film retained on the top of metal lines, as shown in FIG. 1. If the film density is known, the relationship between e-beam penetration depth (or e-beam curing depth) may be determined according to the Grun equation as following:

$$R_g = (0.046/d) V_a^{1.75} \quad (1)$$

where $R_g$ is the range of electrons in the material ($\mu$m) or Grun range, d is film density (g/cm$^3$) and $V_a$ is accelerating voltage or electron energy (KeV).

However, the relationship between e-beam curing depth and electron energy can be established by conducting a series of experiments for the specific material under different levels of e-beam energy.

Figure 2:
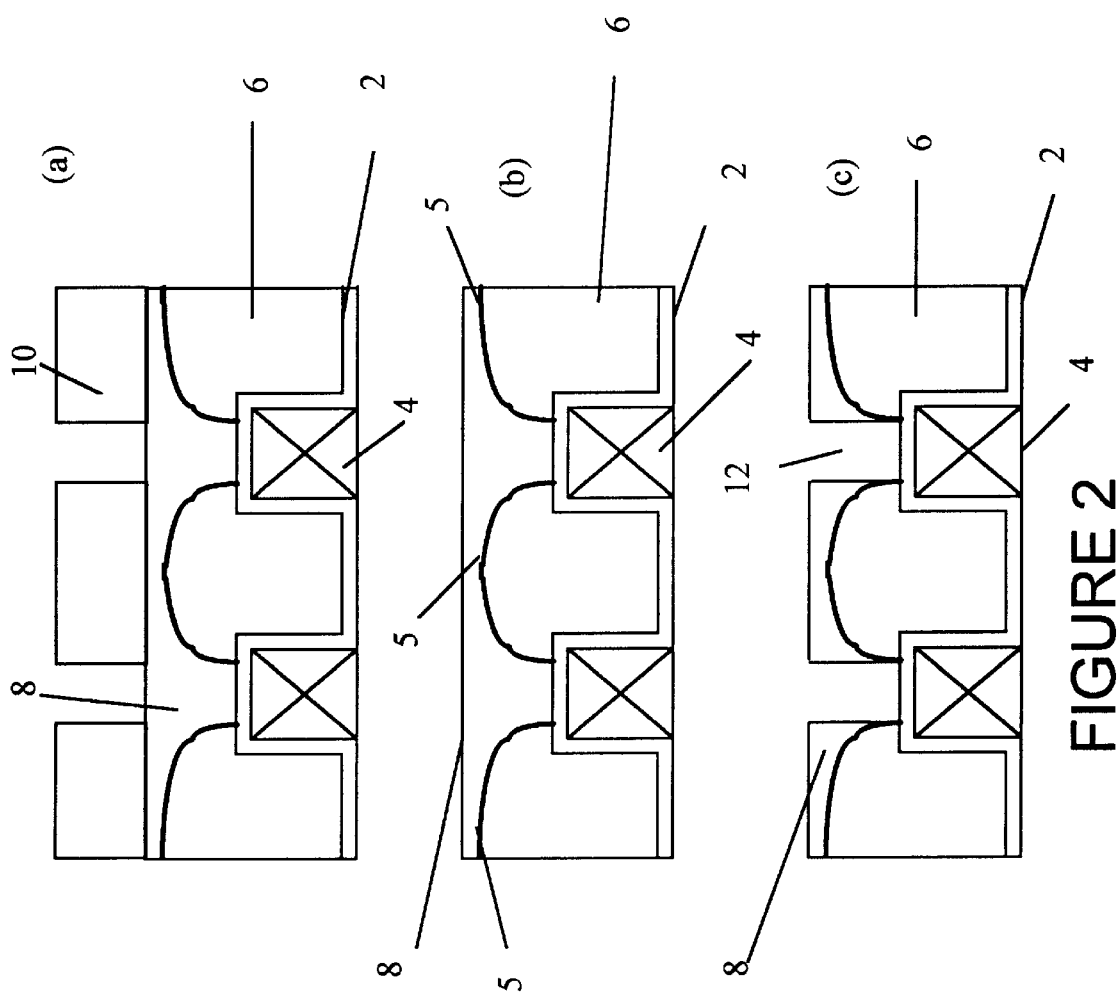
FIGS. 2a, 2b, and 2c are schematic representations of another embodiment of the invention showing a non-etchback process for spin-on low-k polymers using selective electron beam curing of a dielectric under removed portions of a photoresist layer.

The amount of e-beam dose applied to the dielectric film will depend on the desired characteristics of the resulting film. Greater e-beam doses have beneficial effect for those films susceptible to moisture absorption and oxidation. However, greater e-beam doses will result in gradual transition from e-beam cured to non e-beam cured and thus the electron beam penetrate beyond the desired depth of the film due to secondary e-beam scattering. Therefore, the amount of e-beam dose is also preferred to be selected by conducting a series of experiments involving various amounts of doses under the desired e-beam energy level. The exposed dielectric layer preferably has a dielectric constant in the range of from about 2.6 to about 4.0, depending on the selected polymer materials. Preferably the dielectric constant of the relatively more hardened topmost portion of the dielectric layer is different from the dielectric constant of the relatively less hardened underlying portion of the dielectric layer. The less exposed or non-exposed underlying portion of the dielectric layer preferably will retain its intrinsic dielectric constant, or it may vary slightly. Optionally one may thereafter further heat the dielectric layer under conditions sufficient to remove electron beam exposure induced by-products after the electron beam exposure. Such may be done at a temperature of from about 50° C. to about 500° C. for from about 1 minute to about 360 minutes, preferably at a temperature of from about 150° C. to about 425° C. for from about 3 minutes to about 60 minutes The invention also provides a method for non-etchback processing of a low dielectric constant intermetal dielectric film comprising applying and drying the dielectric polymer composition to the surface of a semiconductor substrate having conductive lines. A photoresist is applied to the dielectric polymer composition and exposed to actinic radiation and developed in a conventional way, such that is the portion of the photoresist directly above conducting metal lines on the device is exposed and removed. The substrate is then subjected to electron beam radiation, thus fully curing only that portion of the dielectric film that is directly above the metal lines. Finally the remaining photoresist is removed using conventional photoresist stripping processes. FIG. 2(a) (b) and (c) show a chemically vapor deposited oxide 2 which covers metal conductors 4 on a substrate. A dielectric polymer is spin coated onto the oxide and baked until dried. FIG. 2(a) shows photoresist 10 applied to the dielectric polymer composition and exposed and developed in a conventional way such that the removed portions of the photoresist are over the metal conductors 4. The polymer is exposed to e-beam radiation where the photoresist is imagewise removed such that the e-beam penetration is controlled to area 8 of the dielectric film on top of the metal conductors. FIG. 2(b) shows the structure after e-beam exposure and subsequent stripping away of the entire photoresist layer. The underlying regions 6 have received little or no e-beam exposure. Then vias 12 are formed in the usual way to form the structure shown in FIG. 2(c). Here the remaining photoresist also functions as a mask to prevent electrons from penetrating deeply into the dielectric region 6. Line 5 approximates the electron beam penetration depth profile.

Suitable positive photoresist compositions and methods of their use are described, for examples in U.S. Pat. Nos. 3,666,473; 4,115,128 and 4,173,470. These include water insoluble, aqueous alkali-soluble resins together with light-sensitive materials. Upon imagewise exposure of desired portions exposed to actinic radiation, the photoresist is rendered alkali soluble and the exposed areas of the coating therefore become more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate. The photoresist coating protects the areas 6 from e-beam exposure.

The following non-limiting examples serve to illustrate the invention.

EXAMPLE 1

Partial E-Beam Curing:

Silicon wafers (substrates) were coated using conventional spin-coating with a solution comprising a hydrogen silsesquioxane polymer and a mixture of organic solvents. The coated wafers were subjected to successive hot plate treatments of 1 minute at 150° C. followed by 1 minute at 180° C. and finally 1 minute at 275° C. The coated wafers were then exposed to an electron beam in an electron beam exposure tool (ElectronCure 30™ from Electron Vision, a unit of AlliedSignal Inc.) under conditions given in the Table 1. The coated wafers were removed from the electron beam tool and characterized in the following aspects such as retention of Si—H bonding as a function of e-beam energy and e-beam dose using a FTIR analysis method and wet etching rate through film thickness as a function of e-beam energy and e-beam dose. This experiment was designed to verify partial e-beam curing approach (partial e-beam curing means that under such a condition electron beam penetration is restricted to a certain depth of the film which is less than the total film thickness) and its dependence on e-beam energy and e-beam dose.

TABLE 1

| Wafer ID | Thermal Treatment Prior to E-Beam | E-Beam Exposure Conditions | | | | | Film Characteristics | |
|---|---|---|---|---|---|---|---|---|
| | | Energy (KeV) | Dose $\mu C/cm^2$ | Temp. (° C.) | Current (mA) | Amb. Gas | Si—H Retent (%) | Wet Etch Rate through the Film Depth |
| 1 | Bake and Thermal Cure as a control | | | | | | | |
| 2 | Bake | 3 | 3000 | 250 | 15 | Argon | 69 | Wet etch rate rapidly increases from film depth about 1000 Å. |
| 3 | Bake | 3 | 7500 | 250 | 15 | Argon | 56 | Wet etch rate rapidly increases from film depth about 1000 Å. |
| 4 | Bake | 5.5 | 5000 | 250 | 15 | Argon | 22 | Uniform throughout the entire thickness of the film |
| 5 | Bake | 8 | 3000 | 250 | 15 | Argon | 27 | Uniform throughout the entire thickness of the film |
| 6 | Bake | 8 | 7500 | 250 | 15 | Argon | 10 | Uniform throughout the entire thickness of the film |

Bake: 1 minute at 150° C. for 1 minute and then at 180° C. for 1 minute at 275° C. Thermal Cure: 30 minutes at 400° C. under atmospheric pressure with nitrogen flow of 15 liters per minute.

Figure 3:
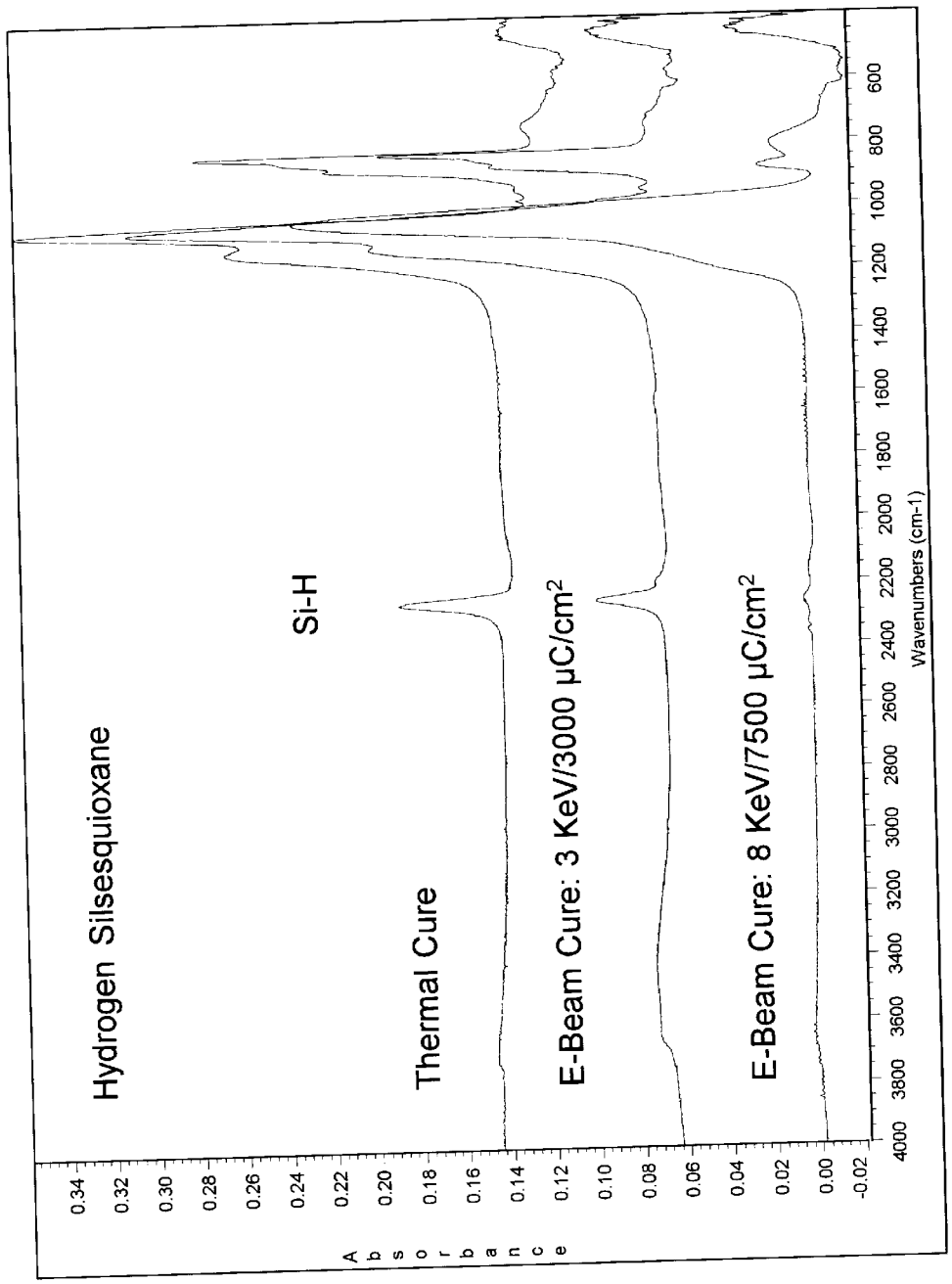
FIG. 3a shows FTIR spectra of thermally cured, partially e-beam cured and fully e-beam cured hydrogen silsesquioxane polymer films.
FIG. 3b shows FTIR spectra of partially e-beam cured hydrogen silsesquioxane polymer films at different e-beam doses.
Figure 3:
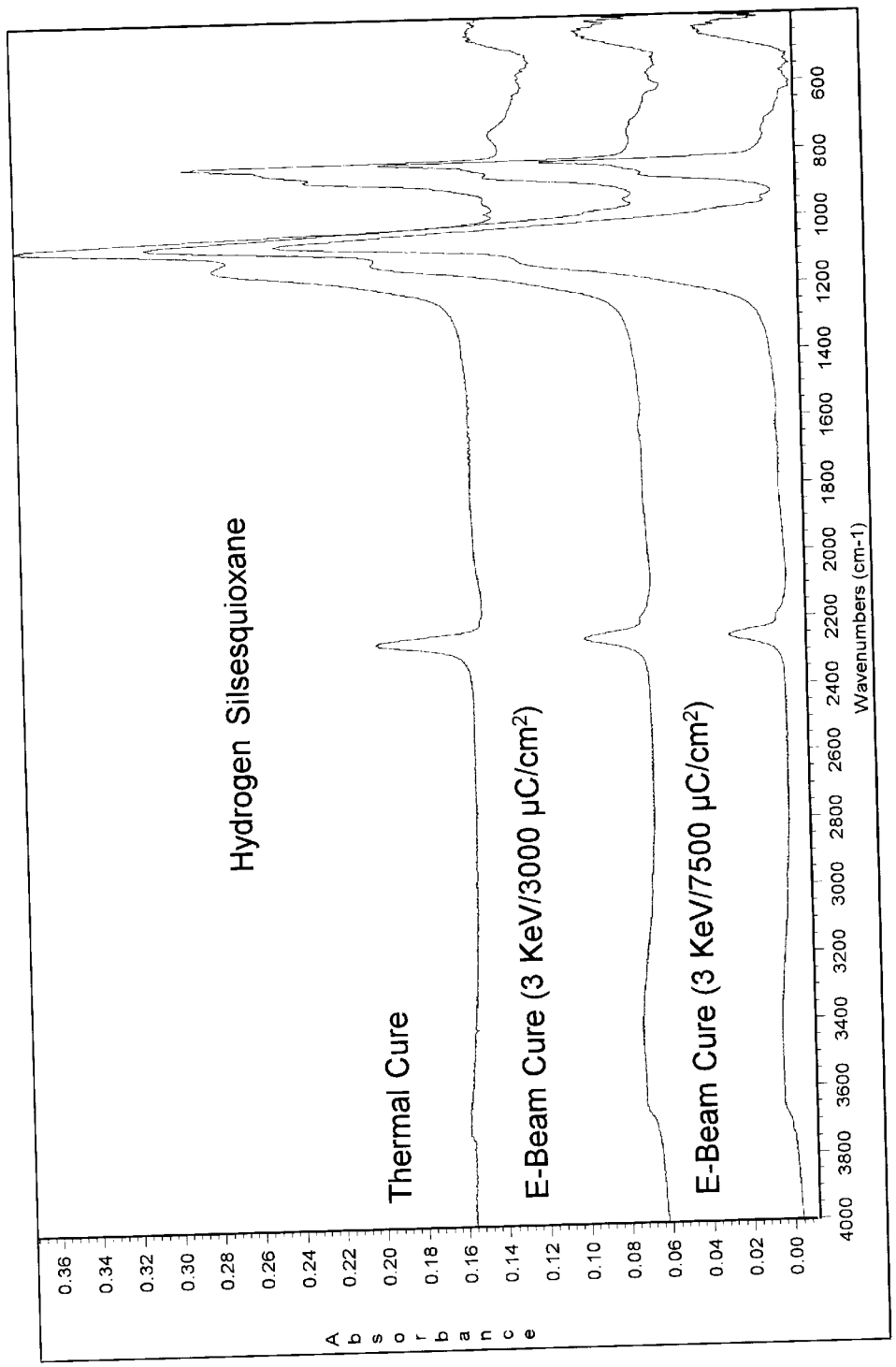
Figure 4:
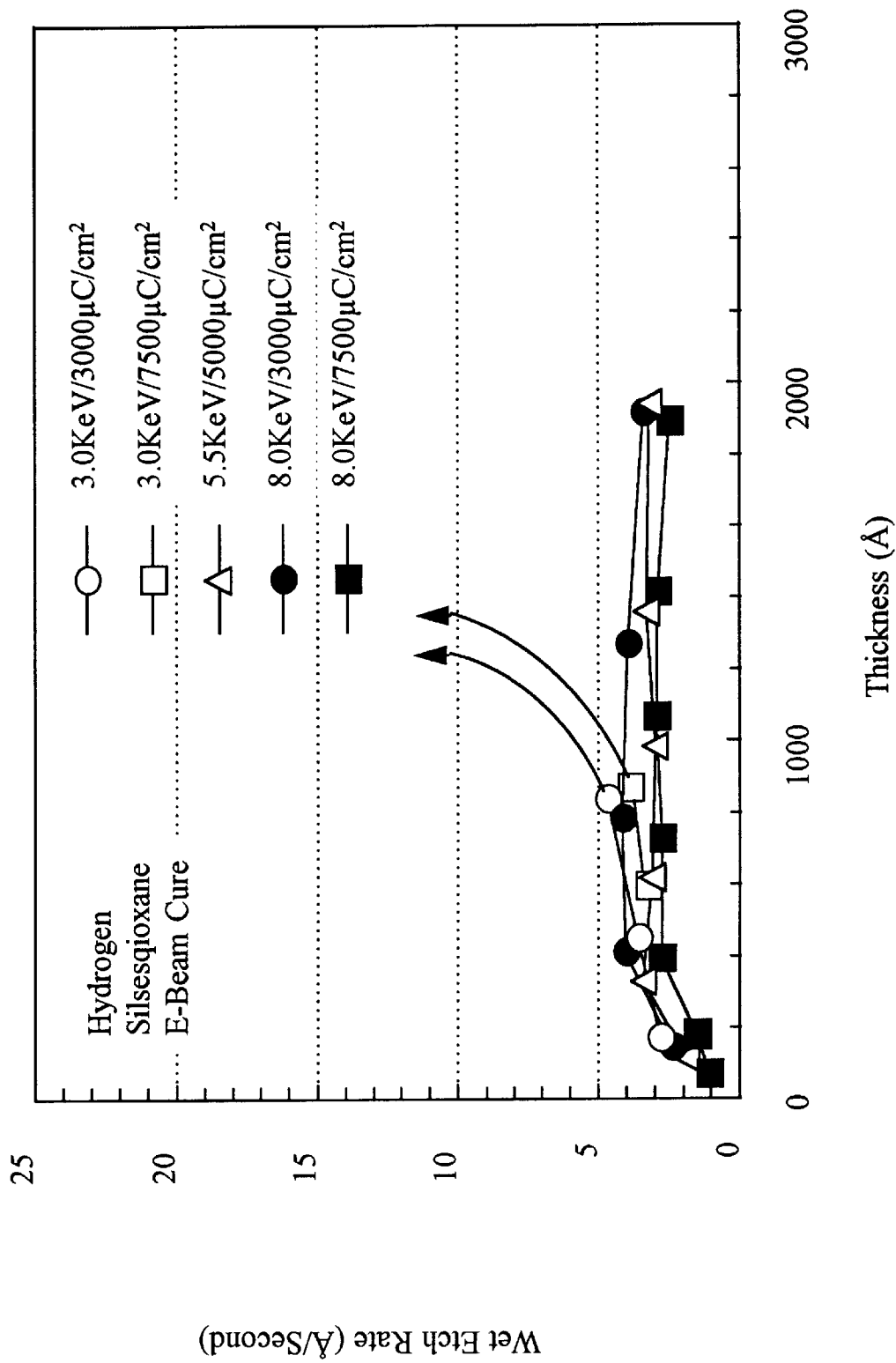
FIG. 4 shows wet etch rates in BOE (50:1) as a function of depth of film thickness for hydrogen silsesquioxane films subjected to various e-beam exposure conditions.

The Si—H peak at a wavenumber of about 2265 cm[1] from FTIR spectra is a characteristic peak for the hydrogen silsesquioxane polymer. Electron beam exposure can decompose the Si—H bonding and drive the hydrogen to diffuse out from the polymer film. Also, electron beam exposure will densify the polymer film. This will modify the hydrogen silsesquioxane film to become more similar to silicon dioxide ($SiO_2$) in chemical structures as well as in physical properties. The penetration depth of energized electrons (or Grun Range) is dependent on the energy level of electrons and the material density, and for a given material the electron penetration depth is exclusively dependent on the energy level of electrons. In reference to the results given in Table 1 and FIGS. 3(*a*), 3(*b*) and 4. The retention of Si—H bonding for e-beam exposure at energy of 3 KeV is as high as 56–69% of the thermally-cured film, indicating that the electron penetration depth was much less than the film thickness (about ⅓ of the film thickness). However, for the e-beam energy of 5.5 and 8 KeV, the peak of Si—H bonding has been significantly reduced, indicating the entire layer of the polymer film was exposed to the electron beam. Also, as shown in FIG. 4, for e-beam exposure at 3 KeV, the wet etching rate is relatively uniform up to film thickness of about 1000 Å, and then it dramatically increases with the depth of the film thickness. This also indicates that the topmost 1000 Å thickness layer of this film is harder than the rest part of the film. For the films exposed to higher energy, the wet etch rate throughout the entire thickness is relatively uniform. In addition, it is clearly seen that the influence of e-beam dose on the e-beam curing depth is not as significant as the e-beam energy.

EXAMPLE 2

Thermal Stability

Silicon wafers were coated using conventional spin-coating with a solution comprising a hydrogen silsesquioxane polymer and a mixture of organic solvent. The coated wafers were subjected to successive hot plate treatments of 1 minute at 150° C. followed by 1 minute at 180° C. and finally 1 minute at 275° C. Then, the coated wafers were separated into two sets, one for thermal cure as a control (refer to as thermal cure) and the other one for partial electron beam cure (refer to as partial e-beam cure). The coated wafers in the thermal cure group were thermally cured in a horizontal furnace at 400° C. for 30 minutes under atmospheric pressure with nitrogen flow of 10 liters per minute. The coated wafers in the other group were exposed to electron beam under a condition of partial curing (Energy: 3 KeV; Dose: 3000 $\mu C/cm^2$; Temperature: 250° C.; Current: 15 mA and argon gas ambient). Then, one wafer from each group was exposed to 400, 450, 500 and 600° C., respectively, for 30 minutes in horizontal furnace under atmospheric pressure with nitrogen flow of 10 liters per minute, and then film thickness, shrinkage and FTIR analyses were conducted on these wafers to evaluate thermal stability (Si—H bond retention and film shrinkage). The results are shown in Table 2.

TABLE 2

| Curing Method | Si—H Retention (%) | | | | Film Shrinkage (%) | | | |
| --- | --- | --- | --- | --- | --- | --- | --- | --- |
| | 400° C. | 450° C. | 500° C. | 600° C. | 400° C. | 450° C. | 500° C. | 600° C. |
| Thermal Cure | 87.7 | 55.3 | 29.5 | 25.4 | 0.9 | 4.0 | 7.6 | 11.4 |
| Partial E-Beam Cure | 99.0 | 89.1 | 80.6 | 37.5 | 0.4 | 1.1 | 2.4 | 9.3 |

Figure 5:
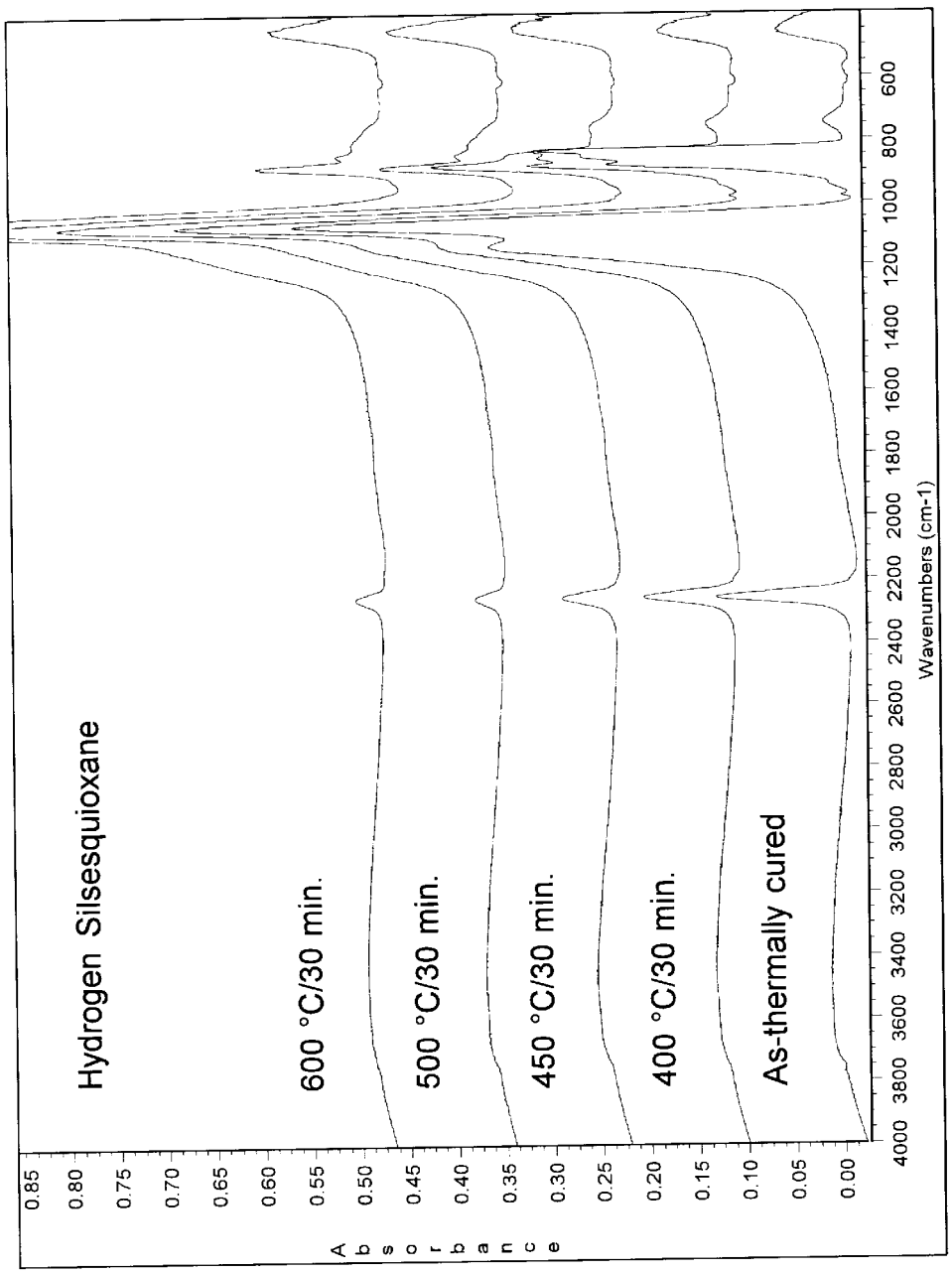
FIG. 5a shows FTIR spectra for thermally cured hydrogen silsesquioxane polymer films after exposure to 400° C., 450° C., 500° C. and 600° C. for 30 minutes respectively.
FIG. 5b shows FTIR spectra for partially e-beam cured hydrogen silsesquioxane polymer films after exposure to 400° C., 450° C., 500° C. and 600° C. for 30 minutes respectively.

As shown in Table 2 and FIG. 5(a), and 5(b), for thermally-cured film, the retention of Si—H bonds decreases rapidly with increasing temperature of thermal exposure, and the film shrinkage significantly increases with temperature. However, for the partial e-beam cure film, the retention of Si—H bonds is much higher and the shrinkage is much lower than the former case for given thermal exposure temperature. These results indicate that partial e-beam cure significantly enhanced the thermal stability, at least up to 500° C. In current IC manufacturing practices pertaining to backend processing, the temperature involved is rarely higher than 450° C. Such an improvement in thermal stability of this polymer film by partial e-beam exposure would lead to significant benefit to manufacturing easiness, reliability, yield and hence manufacturing cost.

EXAMPLE 3
Oxygen Plasma Resistance

Silicon wafers were coated using conventional spin-coating with a solution comprising a methyl silsesquioxane polymer and a mixture of organic solvent. The coated wafers were subjected to successive hot plate treatments of 1 minute at 180° C. followed by 1 minute at 180° C. and finally 1 minute at 250° C. Then, the coated wafers were separated into three sets, one for thermal cure as a control (refer to as thermal cure), and the other two for partial electron beam cure (referred to as partial e-beam cure 1 and partial e-beam cure 2). The coated wafers in the thermal cure group were thermally cured in a horizontal furnace at 425° C. for 60 minutes under atmospheric pressure with nitrogen flow of 15 liters per minute. The coated wafers in the partial e-beam cure 1 were exposed to electron beam under a condition of Energy: 2 KeV; Dose: 3000 $\mu C/cm^2$; Temperature: 250° C.; Current: 15 mA and argon gas ambient. The coated wafers in the partial e-beam cure 2 were exposed to electron beam under the same condition as partial e-beam cure 1 except for the energy which was 3 KeV in this case. Then, all wafers were exposed to oxygen plasma in a Gasonic Aura 1000 stripper tool for 60 seconds under a condition of oxygen flow: 4.5 l/minute; Nitrogen Flow: 0.45 liter/minute; and temperature: about 250° C. Then, FTIR analysis for the retention of Si—C (wavenumber ~1280 $cm^{-1}$) and C—H (wavenumber ~2970 $cm^{-1}$) bonds, and FTIR analysis for water or silanol (Si—OH) absorption, and film shrinkage were characterized. The results are shown in Table 3 and FIGS. 6(a)–(c).

TABLE 3

| Curing Method | Si—C Retention (%) | C—H Retention (%) | Si—OH or $H_2O$ (%) | Film Shrinkage (%) |
| --- | --- | --- | --- | --- |
| Thermal Cure | 19 | 34 | 0.59 | 17.6 |
| Partial E-Beam Cure 1 | 101 | 100 | 0.10 | 1.2 |
| Partial E-Beam Cure 2 | 102 | 100 | 0.13 | −1.4 |

Figure 6A:
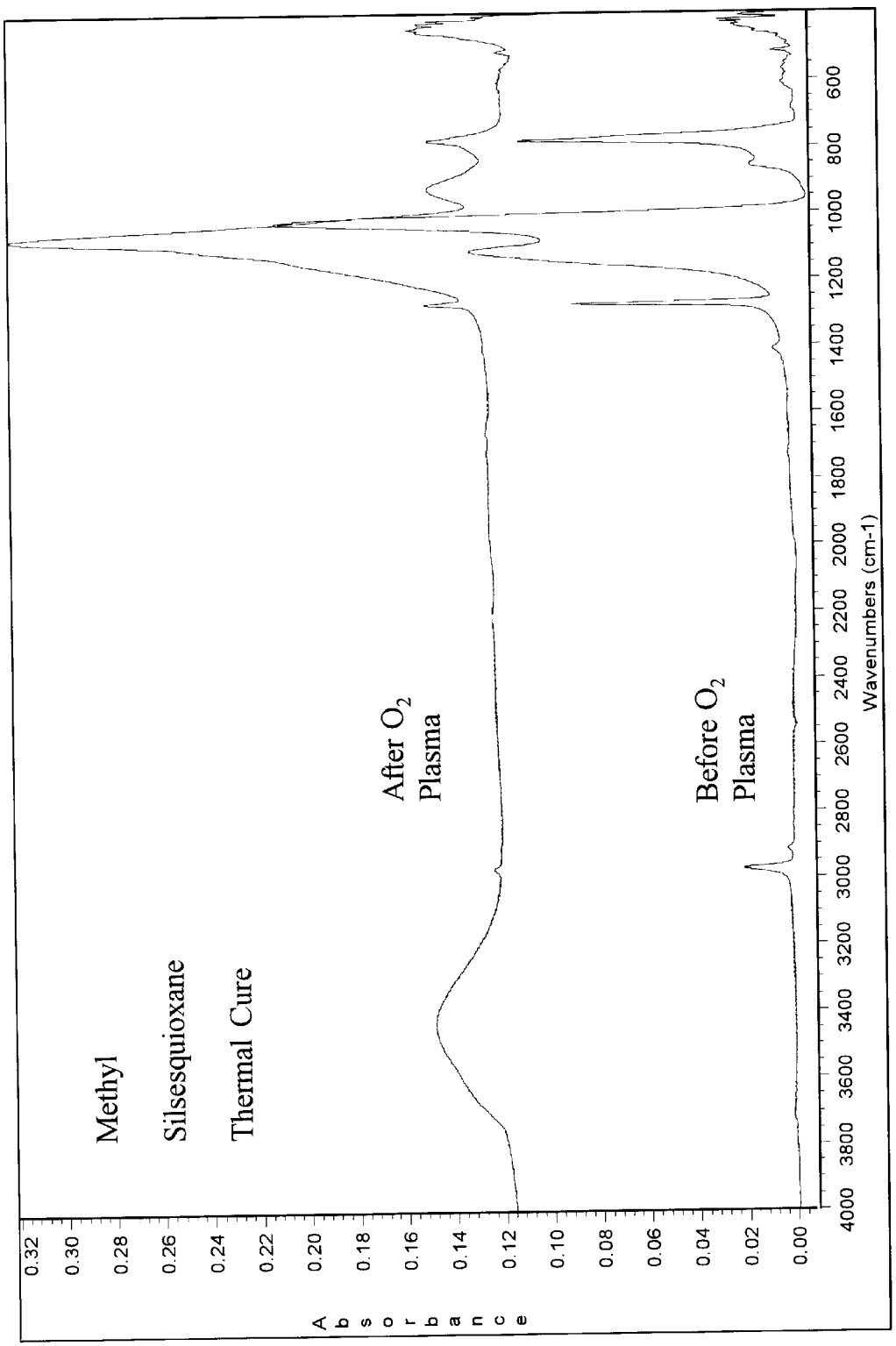
FIG. 6a shows FTIR spectra for thermally cured methyl silsesquioxane polymer films before and after oxygen plasma exposure.
Figure 6B:
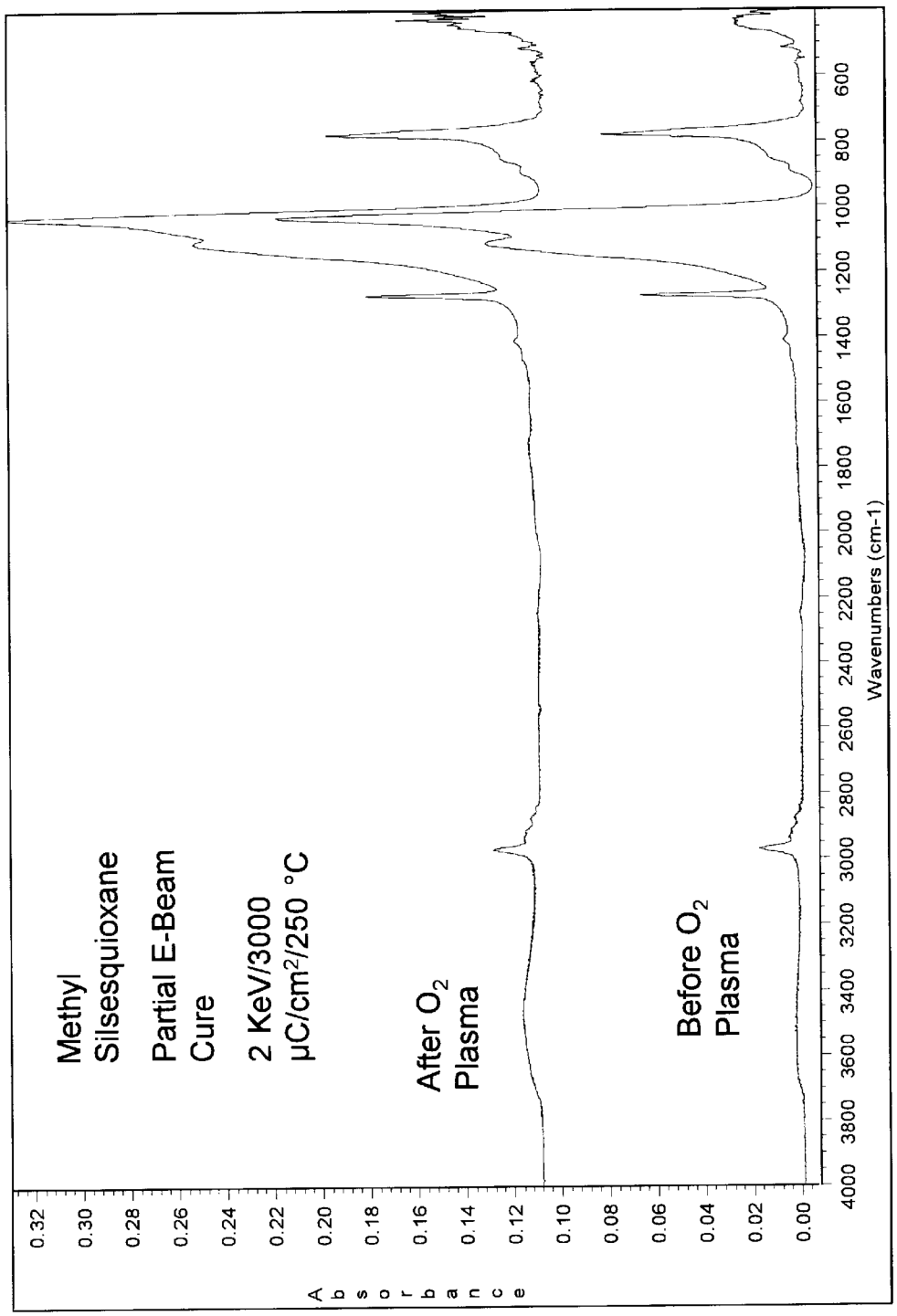
FIG. 6b shows FTIR spectra for partially e-beam cured (partial e-beam cure 1) methyl silsesquioxane polymer films before and after oxygen plasma exposure.
Figure 6C:
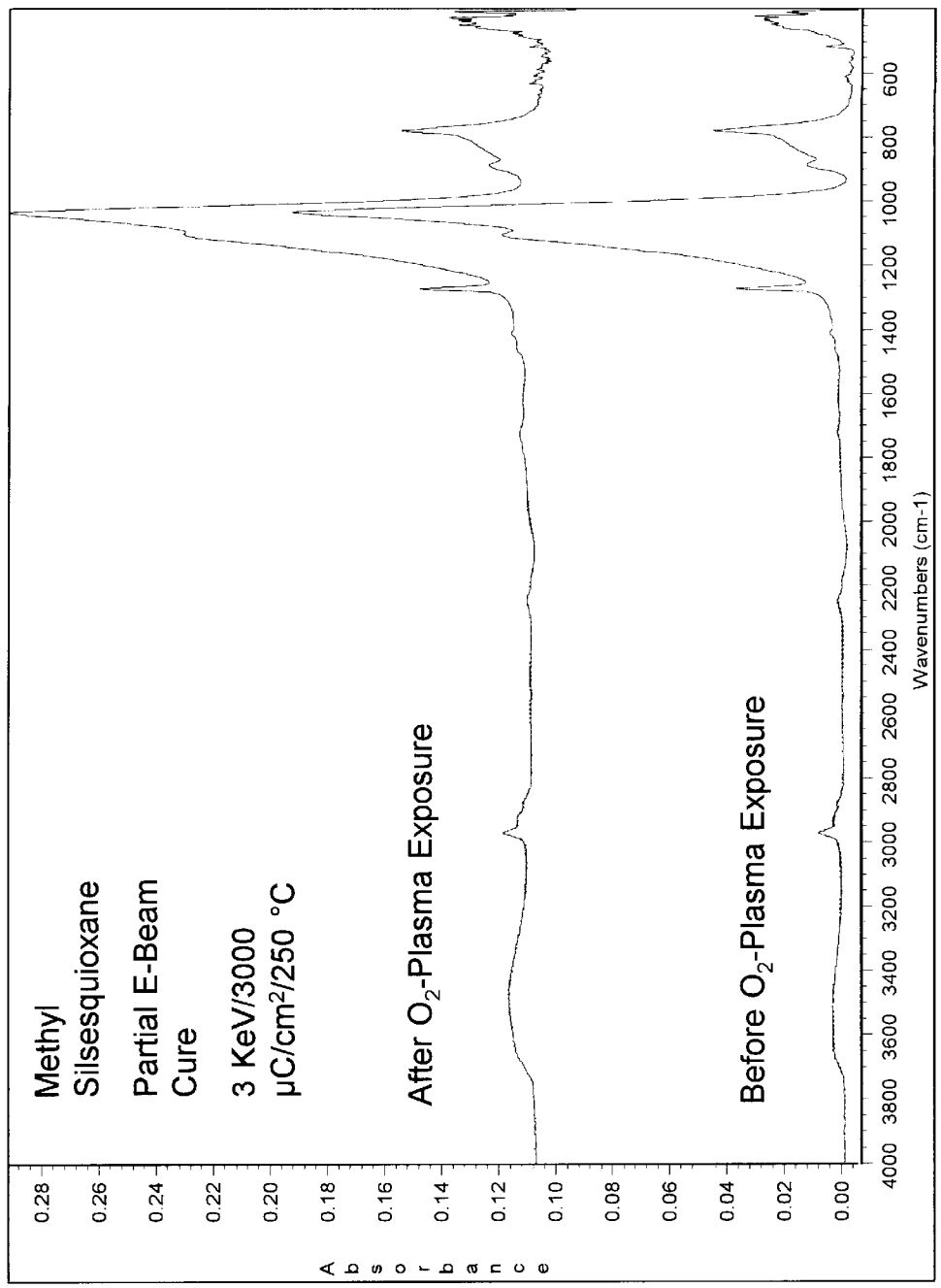
FIG. 6c shows FTIR spectra for partially e-beam cured (partial e-beam cure 2) methyl silsesquioxanepolymer films before and after oxygen plasma exposure.

As shown in Table 3 and FIGS. 6(a)–(c), for the thermally-cured methyl silsesquioxane film the content of Si—C and C—H was significantly reduced along with significant absorption of water and/or silanol, and a large film shrinkage upon oxygen-plasma exposure, indicating the film is very susceptible to oxygen plasma. On the contrary to this, for the e-beam cured films, both Si—C and C—H bonds retained 100% with little film shrinkage and water and/or silanol absorption. Partially electron beam treatment greatly enhanced oxygen plasma resistance of the film.

EXAMPLE 4
Dielectric Constant

Silicon wafers were coated using conventional spin-coating with a solution comprising either a methyl silsesquioxane polymer and a mixture of organic solvent or a hydrogen silsesquioxane polymer and a mixture of organic solvent. The coated wafers were subjected to successive hot plate treatments followed by either thermal curing, partial e-beam curing or full e-beam curing. Table 4 shows the conditions for this experiment with detailed conditions for bake, thermal cure and e-beam cure. Aluminum dots with thickness of about 1 micron and diameter of 0.5 mm were coated on the top of the coated wafers using a conventional sputtering metal deposition tool. The measured dielectric constant data are given in Table 4.

TABLE 4

| Wafer ID | Material | Baking Method | Curing Method | Dielectric Constant |
| --- | --- | --- | --- | --- |
| 1 | Methyl Silsesquioxane | Bake[1] | Thermal Cure[1] | 2.81 |
| 2 | Methyl Silsesquioxane | Bake[1] | Partial E-Beam Cure | 2.92 |
| 3 | Methyl Silsesquioxane | Bake[1] | Full E-Beam[1] Cure | 3.69 |
| 4 | Hydrogen Silsesquioxane | Bake[2] | Thermal Cure[2] | 2.71 |
| 5 | Hydrogen Silsesquioxane | Bake[2] | Partial E-Beam Cure | 2.73 |

TABLE 4-continued

| Wafer ID | Material | Baking Method | Curing Method | Dielectric Constant |
|---|---|---|---|---|
| 6 | Hydrogen Silsesquioxane | Bake[2] | Full E-Beam[2] Cure | 3.64 |

Bake[1]: 1 minute at 180° C. followed by 1 minute at 180° C., and 1 minute at 250° C.
Bake[2]: 1 minute at 150° C. followed by 1 minute at 180° C., and 1 minute at 275° C.
Thermal Cure[1]: 60 minutes at 425° C. in nitrogen flow of 15 liters per minute.
Thermal Cure[2]: 30 minutes at 400° C. in nitrogen flow of 10 liters per minute.
Partial E-Beam Cure: Energy: 2 KeV; Dose: 3000 $\mu C/cm^2$; Temperature: 250° C.; Current: 15 mA; and Argon Gas.
Full E-Beam Cure[1]: Energy: 5 KeV; Dose: 8000 $\mu C/cm^2$; Temperature: 400° C.; Current: 15 mA; and Argon Gas Ambient
Full E-Beam Cure[2]: Energy: 5.5 KeV; Dose: 7500 $\mu C/cm^2$; Temperature: 250° C.; Current: 15 mA; and Argon Gas Ambient As one can see, the exposing forms a relatively more hardened topmost portion of the dielectric layer and a relatively less hardened underlying portion of the dielectric layer. Spin-on low dielectric constant (low-k) polymer films are applied on semiconductor substrates and processed without losing the low dielectric constant feature of the film, utilizing electron beam radiation.

What is claimed is:

1. A process for forming a dielectric film on a substrate which comprises applying and drying a polymeric, dielectric composition layer onto a substrate and exposing the dried layer to electron beam radiation under conditions sufficient to partially cure the dielectric composition layer and wherein the exposing forms a relatively more harden ed topmost portion of the dielectric composition layer and a relatively less hardened underlying portion of the dielectric composition layer.

2. The process of claim 1 wherein the dielectric composition layer comprises a silsesquioxane polymer, a siloxane polymer, a polyimide, a polyarylene ether, a fluorinated polyarylene ether or mixtures thereof.

3. The process of claim 1 wherein the dielectric composition layer has a thickness of from about 500 to about 50,000 angstroms.

4. The process of claim 1 wherein the dielectric constant of the relatively more hardened topmost portion of the dielectric composition layer is different from the dielectric constant of the relatively less hardened underlying portion of the dielectric composition layer.

5. The process of claim 1 wherein the topmost portion of the dielectric composition layer is exposed to the electron beam radiation and the underlying portion of the dielectric composition layer is not exposed to the electron beam radiation.

6. The process of claim 1 wherein the dielectric composition layer has a thickness of from about 500 to about 50,000 angstroms and topmost portion of the dielectric composition layer has a thickness of from about 200 to about 10,000 angstroms.

7. The process of claim 1 wherein the substrate comprises a semiconductor material.

8. The process of claim 1 wherein the dielectric composition layer comprises at least one polymer having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl.

9. The process of claim 1 wherein the dielectric composition layer comprises hydrogen silsesquioxane or methyl silsesquioxane.

10. The process of claim 1 further comprising the step of heating the dielectric composition layer under conditions sufficient to form an at least partially solidified dielectric composition layer on the substrate either prior to or during the electron beam exposing.

11. The process of claim 10 wherein the heating is conducted at a temperature of from about 25° C. to about 500° C. for from about 1 to about 360 minutes.

12. The process of claim 10 further comprising the steps, before electron beam exposing, of applying a layer of a photoresist onto the at least partially solidified dielectric composition layer on the substrate, imagewise exposing and developing the photoresist layer to thereby remove a portion of the photoresist layer from the dielectric composition layer and leaving a portion of the photoresist remaining on the dielectric composition layer; wherein the part of the dielectric composition layer underlying the portion of the photoresist remaining on the dielectric composition layer is exposed to less electron beam radiation than the part of the dielectric composition layer corresponding to the removed portion of the photoresist layer.

13. The process of claim 10 wherein the electron beam exposing forms a substantially uniformly hardened dielectric composition layer.

14. The process of claim 12 further comprising the subsequent step of removing the portion of the photoresist remaining on the dielectric composition layer.

15. The process of claim 12 further comprising the subsequent step of forming a via through the part of the dielectric composition layer corresponding to the removed portion of the photoresist layer to the substrate.

16. The process of claim 15 wherein the portion of the substrate underlying the via comprises an electrically conductive material.

17. The process of claim 1 wherein the electron beam exposing is conducted while in the presence of a gas selected from the group consisting of hydrogen, helium, oxygen, argon, nitrogen, xenon and mixtures thereof.

18. The process of claim 1 wherein the electron beam exposing is conducted at a temperature of from about 25° C. to about 500° C.

19. The process of claim 1 wherein the exposed dielectric composition layer has a dielectric constant in the range of from about 2.6 to about 4.0.

20. The process of claim 1 wherein the dielectric composition layer has a density of from about 1 g/cm$^3$ to about 3 g/cm$^3$.

21. The process of claim 1 wherein the electron beam exposing is conducted at an energy level of from about 0.5 KeV to about 20 KeV.

22. The process of claim 1 wherein the electron beam exposing is conducted at an electron dose of from about 500 $\mu C/cm^2$ to about 20,000 $\mu C/cm^2$.

23. The process of claim 1 further comprising the step of heating the dielectric composition layer under conditions sufficient to remove electron beam exposure induced by-products after the electron beam exposure.

24. The process of claim 23 wherein the heating is conducted at a temperature of from about 50° C. to about 500° C. for from about 1 to about 360 minutes.

* * * * *